(12) United States Patent
Kanemoto

(10) Patent No.: US 7,396,733 B2
(45) Date of Patent: Jul. 8, 2008

(54) METHOD FOR MANUFACTURING SEMICONDUCTOR SUBSTRATE AND METHOD FOR MANUFACTURING SEMICONDUCTOR DEVICE

(75) Inventor: Kei Kanemoto, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 78 days.

(21) Appl. No.: 11/605,588

(22) Filed: Nov. 29, 2006

(65) Prior Publication Data

US 2007/0134885 A1 Jun. 14, 2007

(30) Foreign Application Priority Data

Dec. 14, 2005 (JP) ............................. 2005-359984

(51) Int. Cl.
*H01L 21/76* (2006.01)
(52) U.S. Cl. .................. 438/400; 438/421; 438/692; 438/439; 438/752; 438/745; 257/E21.245
(58) Field of Classification Search ................. 438/400, 438/421, 439, 692, 745, 752; 257/E21.245
See application file for complete search history.

(56) References Cited

U.S. PATENT DOCUMENTS

2005/0009263 A1* 1/2005 Yeo et al. ..................... 438/221
2005/0048745 A1* 3/2005 Todd ........................... 438/489

FOREIGN PATENT DOCUMENTS

| JP | 2006-100681 A | 4/2006 |
|---|---|---|
| JP | 2006-108206 A | 4/2006 |
| JP | 2006-210683 | 8/2006 |
| JP | 2006-210810 | 8/2006 |

OTHER PUBLICATIONS

T. Sakai et al., Separation by Bonding Si Islands (SBSI) for LSI Applications, Second International SiGe Technology and Device Meeting, Meeting Abstract, May 2004, pp. 230-231.

* cited by examiner

*Primary Examiner*—Bradley K Smith
(74) *Attorney, Agent, or Firm*—AdvantEdge Law Group, LLC

(57) ABSTRACT

A method for manufacturing a semiconductor substrate, including: forming a first semiconductor layer on a semiconductive base; forming a second semiconductor layer, having a smaller etching selection ratio than that of the first semiconductor layer, on the first semiconductor layer; removing part of the first semiconductor layer and the second semiconductor layer in the vicinity of device region, so as to form a support hole that exposes the semiconductive base; forming a support forming layer on the semiconductive base, so that the support hole is buried and the second semiconductor layer is covered; leaving an region that includes the support hole and the element region, etching the rest, so that an exposed surface is formed, where a part of edges of a support, the first semiconductor layer, and of the second semiconductor layer located at the lower side of the support are exposed; forming a cavity between the second semiconductor layer and the semiconductive base by etching the first semiconductor layer through the exposed surface; forming a buried insulation layer inside the cavity; and planarizing the top side of the second semiconductor layer and removing the part of the support above the second semiconductor layer; wherein, in forming the first semiconductor layer, the first semiconductor layer is deposited with a first condition on a first region where an oxide film does not exist on the semiconductive base.

8 Claims, 6 Drawing Sheets

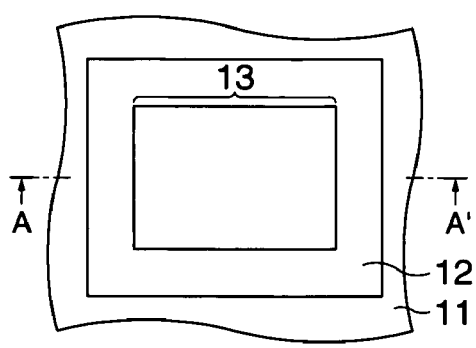 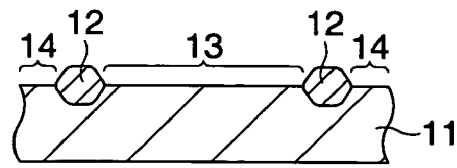
FIG. 1A     FIG. 1B
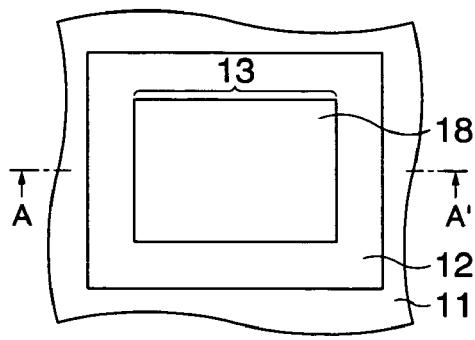 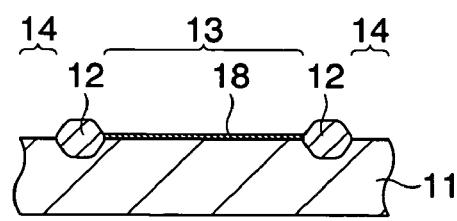
FIG. 2A     FIG. 2B
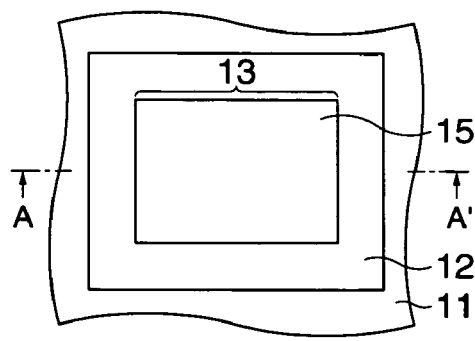 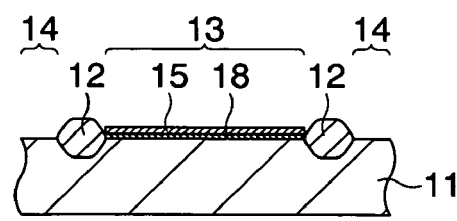
FIG. 3A     FIG. 3B

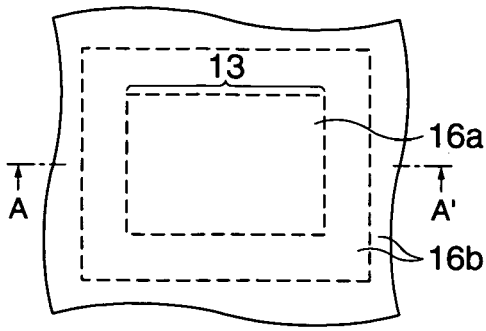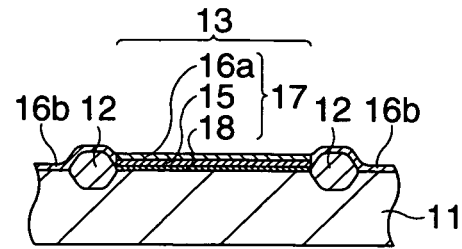
FIG. 4A  FIG. 4B
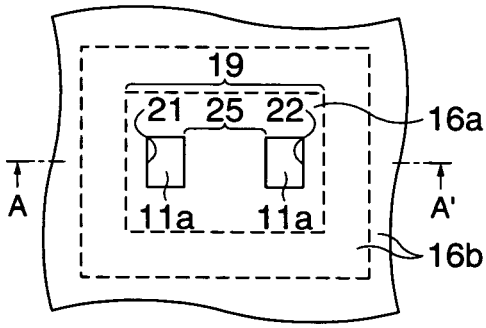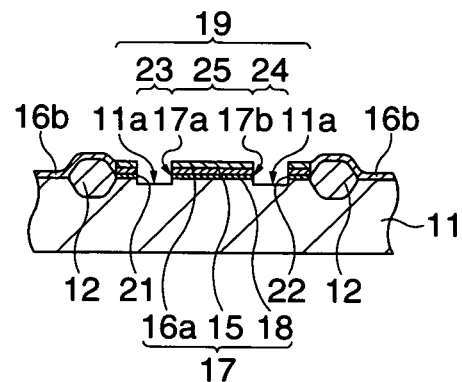
FIG. 5A  FIG. 5B
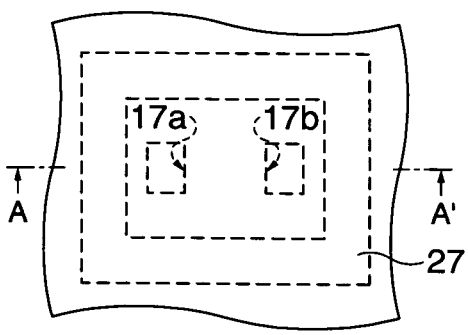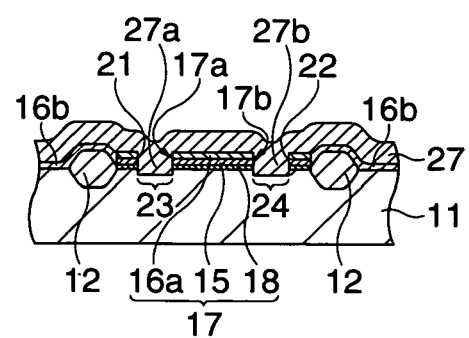
FIG. 6A  FIG. 6B

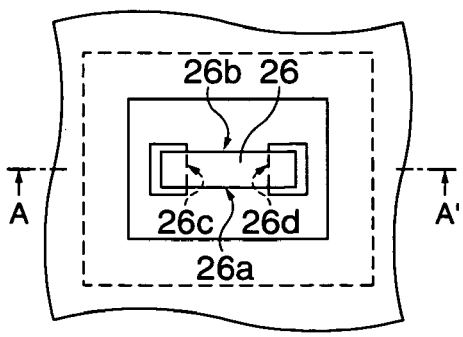
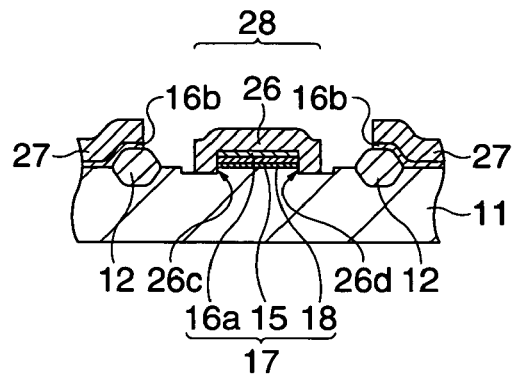
FIG. 7A    FIG. 7B
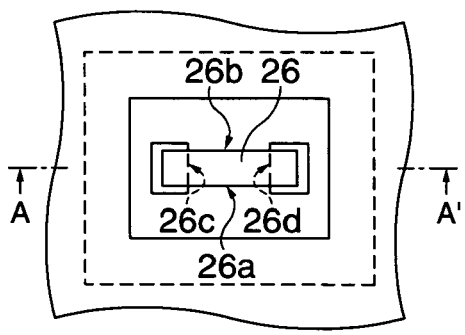
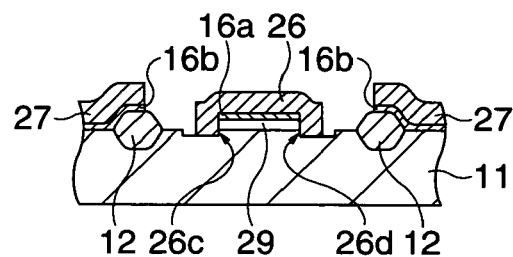
FIG. 8A    FIG. 8B
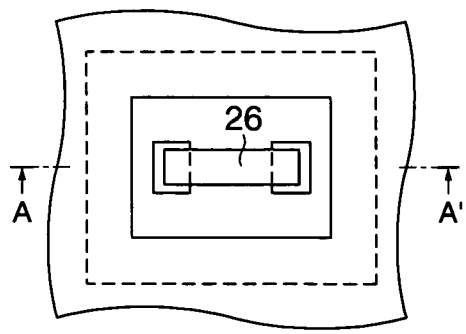
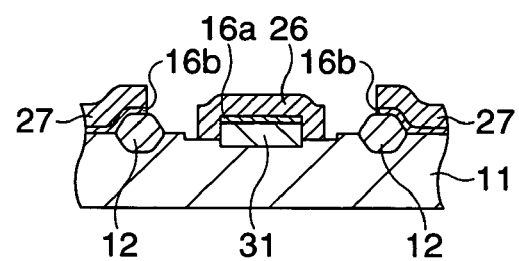
FIG. 9A    FIG. 9B

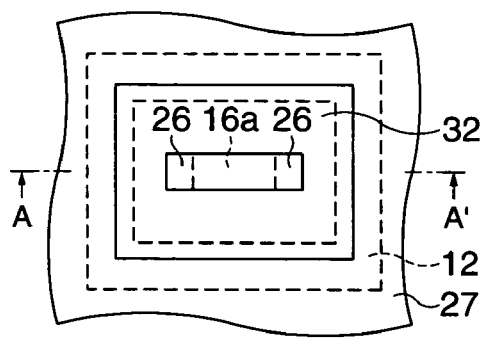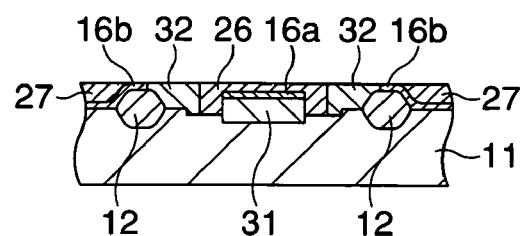
FIG. 10A  FIG. 10B
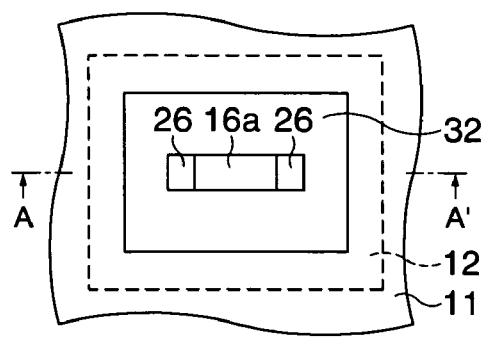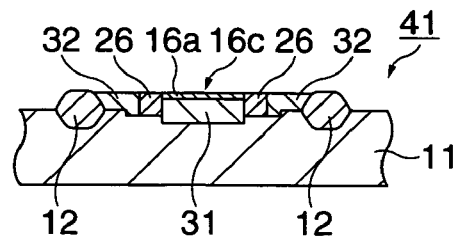
FIG. 11A  FIG. 11B

US 7,396,733 B2

METHOD FOR MANUFACTURING SEMICONDUCTOR SUBSTRATE AND METHOD FOR MANUFACTURING SEMICONDUCTOR DEVICE

BACKGROUND

1. Technical Field

The present invention relates to a method for manufacturing a semiconductor substrate and a method for manufacturing a semiconductor device, particularly to a technique, which forms a silicon on insulator (SOI) structure on a semiconductor substrate.

2. Related Art

In the method for manufacturing the semiconductor device, as described in 'T.Sakai et al., "*Second International SiGe Technology and Device Meeting, Meeting Abstract*, pp. 230-231, May (2004)"', a SOI layer is formed locally on a bulk silicon substrate, and a SOI transistor is formed on the SOI layer, using a method of separation by bonding Si islands (SBSI). The SOI transistor is formed at low cost by locally forming the SOI layer.

The method of forming the SOI structure on a bulk silicon substrate will be described with reference to FIG. 13. FIG. 13 is a schematic sectional drawing showing a part of a manufacturing method of a semiconductor substrate. When forming a SOI structure on a bulk silicon substrate 101, a local oxidation silicon (LOCOS) oxide film 104 may be formed on the bulk silicon substrate, in order to insulate the SOI structure region and the bulk structure region. Un-illustrated oxide film and nitride film formed on the bulk silicon substrate 101 are patterned, and the LOCOS oxide film 104 is formed in the desired location as shown in FIG. 13. Thereafter, after removing the nitride film, the oxide film on the SOI region 102 is removed, and a silicon germanium (SiGe) layer 105 and a silicon (Si) layer 106 are deposited on the bulk silicon substrate 101 by epitaxial growth. Consequently, on the bulk silicon substrate 101 in the SOI region 102, single-crystal silicon layers (an un-illustrated first silicon germanium layer and a first silicon layer 106a), in which a crystalline property of the bulk silicon substrate 101 is reflected, are formed. At the same time, polycrystalline silicon layers 112 (a second silicon germanium layer 105b and a second silicon layer 106b) are formed on the bulk silicon substrate 101 except for the SOI region 102.

Thereafter, a support hole 107a is formed which is for forming the support 107 so that the first silicon layer 106a is supported. An oxide film is deposited for making the support 107, and the circumjacent oxide film, a silicon layer 106, and a silicon germanium layer 105 are dry etched so as to obtain the shape of a device region (forming the support). The first silicon germanium layer under the first silicon layer 106a is then removed by a selective etching using fluoro-nitric acid, thereby forming a cavity beneath the first silicon layer 106a, supported by the support 107. A buried oxide (BOX) layer 108 is formed between the bulk silicon substrate 101 and the first silicon layer 106a, by burring an insulation layer with material such as $SiO_2$. Thereafter, the SOI structure is formed on the SOI region 102 which is on the bulk silicon substrate 101, by planarizing the surface of the bulk silicon substrate 101 and exposing the first silicon layer 106a to the surface.

However, the second silicon germanium layer 105b, formed in the region except for the SOI region 102, is a cause of contamination, not being removed after the support and the BOX layer are formed, remaining exposed to the later processes. This includes the problem that, for instance, the interior atmosphere of a reactor for forming the semiconductor substrate includes germanium, and by the time the semiconductor substrate is completed, the germanium would be deposited on the films and the like of the semiconductor substrate, causing deterioration in the characteristics of transistors, such as a current leak.

SUMMARY

An advantage of the invention is to provide a method for manufacturing a semiconductor substrate and a method for manufacturing a semiconductor device, where the methods suppress the adherence of the contaminated material to the substrate and allow manufacturing without deteriorating the characteristics of transistors.

According to an aspect of the invention, a method for manufacturing a semiconductor substrate, includes: forming a first semiconductor layer on a semiconductive base; forming a second semiconductor layer, having a smaller etching selection ratio than that of the first semiconductor layer, on the first semiconductor layer; removing part of the first semiconductor layer and the second semiconductor layer in the vicinity of device region, so as to form a support hole that exposes the semiconductive base; forming a support forming layer on the semiconductive base, so that the support hole is buried and the second semiconductor layer is covered; leaving an region that includes the support hole and the element region, etching the rest, so that an exposed surface is formed, where a part of edges of a support, the first semiconductor layer, and of the second semiconductor layer located at the lower side of the support are exposed; forming a cavity between the second semiconductor layer and the semiconductive base by etching the first semiconductor layer through the exposed surface; forming a buried insulation layer inside the cavity; and planarizing the top side of the second semiconductor layer and removing the part of the support above the second semiconductor layer; wherein, in forming the first semiconductor layer, the first semiconductor layer is deposited with a first condition on a first region where an oxide film does not exist on the semiconductive base.

With the above method, the first semiconductor layer is deposited in the first condition, in which the first semiconductor layer is selectively formed in the first region where the oxide film is not formed on the semiconductive base. Hence, the buried insulation layer is buried substituting the first semiconductor layer that is in the vicinity of the device region (on the semiconductor substrate in the first region). At the same time, the first semiconductor layer, which is the cause of the contamination, is made not to remain on the semiconductor substrate after burying the buried insulation layer. Consequently, deterioration of characteristics of transistors can be suppressed, the deterioration resulting from the adherence of the contaminated material on the semiconductive base in the subsequent processing. For instance, it is possible to suppress the contaminated material (the first semiconductor layer), which is the cause of the contamination, to spread in the reactor in which processing is performed.

In the method for manufacturing the semiconductor substrate, it is preferable that epitaxial growth technique be used in order to grow the first semiconductor layer and the second semiconductor layer in forming the first semiconductor layer and of forming the second semiconductor layer.

With the above method, since the epitaxial growth technique is used, the first and the second semiconductor layers are formed inheriting the crystalline property of the semiconductive base or of the film formed thereon. For instance, the single-crystal first and second semiconductor layers are formed on the exposed semiconductive base.

In the method for manufacturing the semiconductor substrate, it is preferable that the first condition for forming the first semiconductor layer be maintaining the temperature of the semiconductive base, and depositing the first semiconductor layer on the first region in the thickness of 30 nm With the above method, the first semiconductor layer can be selectively formed only in the first region with a film deposition in the above-referenced first condition. Hence, the buried insulation layer is buried substituting the first semiconductor layer that is in the vicinity of the device region. At the same time, the first semiconductor layer, which is the cause of the contamination, is made not to remain on the semiconductive base after burying the buried insulation layer.

In the method for manufacturing the semiconductor substrate, it is preferable to form, prior to forming the first semiconductor layer, a third semiconductor layer on the semiconductive base, so that the first semiconductor layer is formed inheriting a crystalline property of the semiconductive base; wherein, in forming the third semiconductor layer, the third semiconductor layer is deposited with a second condition, only on a region where the semiconductive base is exposed.

With the above method, the third semiconductor layer is deposited in the second condition, in which the third semiconductor layer is selectively formed only in the first region where the semiconductive base is exposed and the oxide film is not formed thereon. This allows the crystalline property of the semiconductor substrate to be reflected when forming the first semiconductor layer, and the first semiconductor layer to be more easily formed only on the third semiconductor layer on which there is no oxide film. Consequently, the buried insulation layer is buried substituting the first semiconductor layer that is in the vicinity of the device region. At the same time, the first semiconductor layer, which is the cause of the contamination, is made not to remain on the semiconductive base after burying the buried insulation layer.

In the method for manufacturing the semiconductor substrate, it is preferable that the second condition for forming the third semiconductor layer be depositing the third semiconductor layer on the first region in the thickness of 20 nm, while decreasing the temperature of the semiconductive base from 600 degrees centigrade to 450 degrees centigrade inclusive.

With the above method, the third semiconductor layer can be selectively formed only in the first region with a film deposition in the above-referenced second condition. Consequently, the first semiconductor layer is more easily formed only on the third semiconductor layer on which there is no oxide film.

In the method for manufacturing the semiconductor substrate, it is preferable that a deposition condition for forming the second semiconductor layer be depositing the second semiconductor layer on the first semiconductor layer and on the semiconductive base in the thickness of 100 nm, while increasing the temperature of the semiconductive base from 450 degrees centigrade to 600 degrees centigrade inclusive.

With the above method, the single-crystal second semiconductor layer for making a device on the region where the semiconductive base is exposed, is formed. Further, the polycrystalline second semiconductor layer formed on the oxide film can be used as a stopper layer in a planarization processing.

In the method for manufacturing the semiconductor substrate, it is preferable that the first semiconductor layer be composed of a silicon germanium layer; and the second semiconductor layer be composed of a silicon layer.

The above method has the silicon germanium not to remain on the semiconductive base, after burying the buried insulation layer substituting the silicon germanium layer. Hence, it is possible to prevent a negative effect on the semiconductor substrate caused by the adherence of silicon germanium, which is the cause of contamination, on to the semiconductor substrate in the subsequent processing processes. Further, the method allows a selective etching of the silicon germanium layer while keeping the silicon layer, since silicon has a smaller etching selection ratio than that of silicon germanium. Consequently, beneath the silicon layer, a cavity is formed into which the buried insulation layer is buried.

According to another aspect of the invention, it is preferable to include forming of a transistor on the second semiconductor layer after conducting the method for manufacturing the semiconductor substrate.

With the above method, it is possible to make the first semiconductor layer, which is the cause of the contamination, not to remain on the semiconductive base after burying the buried insulation layer substituting the first semiconductor layer. Thus the method for manufacturing the semiconductor device is provided which can maintain the transistor characteristics.

BRIEF DESCRIPTION OF THE DRAWINGS

The invention will be described with reference to the accompanying drawings, wherein like numbers reference like elements.

FIGS. 1A and 1B are views, ones of which that illustrate a frame format of a manufacturing method of a semiconductor substrate according to an embodiment, arranged by the order of processes, where FIG. 1A is a schematic top view drawing showing the manufacturing method of the semiconductor substrate, and FIG. 1B is a schematic sectional drawing showing the manufacturing method of the semiconductor substrate.

FIGS. 2A and 2B are views showing the frame format of the manufacturing method of the semiconductor substrate, where FIG. 2A is a schematic top view drawing showing the manufacturing method of the semiconductor substrate, and FIG. 2B is a schematic sectional drawing showing the manufacturing method of the semiconductor substrate.

FIGS. 3A and 3B are views showing the frame format of the manufacturing method of the semiconductor substrate, where FIG. 3A is a schematic top view drawing showing the manufacturing method of the semiconductor substrate, and FIG. 3B is a schematic sectional drawing showing the manufacturing method of the semiconductor substrate.

FIGS. 4A and 4B are views showing the frame format of the manufacturing method of the semiconductor substrate, where FIG. 4A is a schematic top view drawing showing the manufacturing method of the semiconductor substrate, and FIG. 4B is a schematic sectional drawing showing the manufacturing method of the semiconductor substrate.

FIGS. 5A and 5B are views showing the frame format of the manufacturing method of the semiconductor substrate, where FIG. 5A is a schematic top view drawing showing the manufacturing method of the semiconductor substrate, and FIG. 5B is a schematic sectional drawing showing the manufacturing method of the semiconductor substrate.

FIGS. 6A and 6B are views showing the frame format of the manufacturing method of the semiconductor substrate, where FIG. 6A is a schematic top view drawing showing the manufacturing method of the semiconductor substrate, and FIG. 6B is a schematic sectional drawing showing the manufacturing method of the semiconductor substrate.

FIGS. 7A and 7B are views showing the frame format of the manufacturing method of the semiconductor substrate, where FIG. 7A is a schematic top view drawing showing the manufacturing method of the semiconductor substrate, and FIG. 7B is a schematic sectional drawing showing the manufacturing method of the semiconductor substrate.

FIGS. 8A and 8B are views showing the frame format of the manufacturing method of the semiconductor substrate, where FIG. 8A is a schematic top view drawing showing the manufacturing method of the semiconductor substrate, and FIG. 8B is a schematic sectional drawing showing the manufacturing method of the semiconductor substrate.

FIGS. 9A and 9B are views showing the frame format of the manufacturing method of the semiconductor substrate, where FIG. 9A is a schematic top view drawing showing the manufacturing method of the semiconductor substrate, and FIG. 9B is a schematic sectional drawing showing the manufacturing method of the semiconductor substrate.

FIGS. 10A and 10B are views showing the frame format of the manufacturing method of the semiconductor substrate, where FIG. 10A is a schematic top view drawing showing the manufacturing method of the semiconductor substrate, and FIG. 10B is a schematic sectional drawing showing the manufacturing method of the semiconductor substrate.

FIGS. 11A and 11B are views showing the frame format of the manufacturing method of the semiconductor substrate, where FIG. 11A is a schematic top view drawing showing the manufacturing method of the semiconductor substrate, and FIG. 1B is a schematic sectional drawing showing the manufacturing method of the semiconductor substrate.

FIG. 12A is a schematic top view drawing showing the manufacturing method of the semiconductor substrate, FIG. 12B is a schematic sectional drawing showing the manufacturing method of the semiconductor substrate, and FIG. 12C is a schematic sectional drawing showing the manufacturing method of the semiconductor substrate.

DESCRIPTION OF EXEMPLARY EMBODIMENTS

Figure 12A:
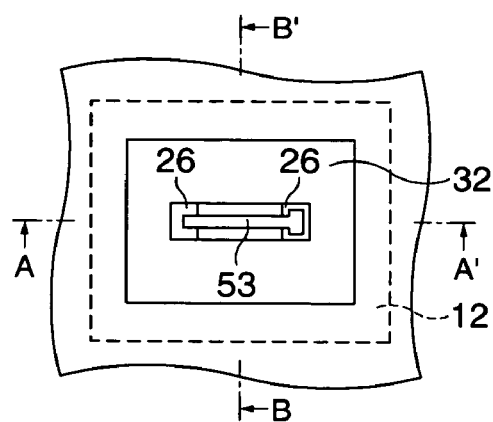
FIGS. 12A to 12C are views showing the frame format of the manufacturing method of the semiconductor substrate, where

The embodiment of the method for manufacturing the semiconductor substrate and the method for manufacturing the semiconductor device in accordance with the invention will now be described with references to the accompanying drawings.

FIGS. 1A to 11B are schematic drawings showing the manufacturing method of the semiconductor substrate. FIGS. 1A, 2A, . . . 11A are schematic top view drawings, and FIGS. 1B, 2B, . . . 11B are schematic sectional drawings along the section A-A' of FIGS. 1A, 2A, . . . 11A. The method for manufacturing the semiconductor device will be described with reference to drawings FIGS. 1A to 11B. The semiconductor substrate has a SOI device forming region and a bulk device forming region, in order to form a mixed structure having the SOI structure in which a SOI device is formed and the bulk structure in which a bulk device is formed. Hereafter, the method for manufacturing the semiconductor substrate, mainly for the SOI device forming region, will be described.

In the process shown in FIGS. 1A and 1B, a device isolation film 12 is formed on a silicon substrate 11 as a semiconductive base (bulk silicon substrate). The isolation film 12 is, for instance, a local oxidation of silicon (LOCOS) oxide film. The device isolation film 12 is formed in order to electrically insulate a SOI device forming region 13 from a bulk device forming region 14, where a transistor of SOI structure is formed in the SOI device forming region 13, and a transistor of bulk structure is formed in the bulk device forming region 14. First, an un-illustrated silicon oxide film ($SiO_2$) is formed on the entire silicon substrate 11. Thereafter, an un-illustrated silicon nitride film (SiN) is formed on the silicon substrate 11 within the SOI device forming region 13 and within the bulk device forming region 14, using photolithography techniques. Subsequently, using the silicon nitride film as a mask, the silicon substrate 11 is oxidized, except for the regions for the SOI device forming region 13 and the bulk device forming region 14. Consequently, the device isolation film 12 is formed on the silicon substrate 11, in the region except for the SOI device forming region 13 and the bulk device forming region 14.

In the process shown in FIGS. 2A and 2B, a silicon buffer (Si buffer) layer 18 is formed as a third semiconductor layer on the silicon substrate 11. Specifically, the silicon buffer layer 18 is selectively formed only on to the SOI device forming region 13 on the silicon substrate 11, using epitaxial growth technique (selective epitaxial growth). As a method for selective forming, a phenomenon is utilized in which the film grown by the epitaxial growth is less likely to grow if its thickness is at prescribed thickness or less on the oxide film. First, a silicon oxide film (not shown) on the silicon substrate 11 in the SOI device forming region 13 is removed using the photolithography. The silicon substrate 11 is thereby exposed only on the SOI device forming region 13.

Thereafter, using epitaxial growth technique, the silicon buffer layer 18 is formed with epitaxy as an undercoat layer on the entire silicon substrate 11. The epitaxial growth is, as described, selectively carried out only on to the SOI device forming region 13 to form the silicon buffer layer 18. In the deposition condition which is a second condition, the silicon buffer layer 18 can be deposited only on the region where the surface of the silicon substrate 11 is not covered with an oxide film (SOI device forming region 13). For instance, the layer is grown on the silicon substrate 11 in the SOI device forming region 13, by, for example, 20 nm, using disilane ($Si_2H_6$) gas, while decreasing the temperature of the silicon substrate 11 from 600 degrees C. to 450 degrees C. Consequently, a single-crystal silicon buffer layer 18, inheriting the crystalline property of the silicon substrate 11, newly grows on the SOI device forming region 13. On the other hand, the silicon buffer layer 18 is not formed in the regions covered with oxide film, the regions except for the SOI device forming region 13 (i.e., the region on the silicon substrate 11 in the bulk device forming region 14, and the region on the device isolation film 12).

In the process shown in FIGS. 3A and 3B, on the silicon buffer layer 18, a silicon germanium (SiGe) layer 15 is formed as the first semiconductor layer, being used as a sacrifice layer. Similar to the silicon buffer layer 18, the epitaxial growth is selectively carried out only on to the SOI device forming region 13 to form the silicon germanium layer 15. In the deposition condition which is the first condition, the silicon buffer layer 15 can be deposited only on the region where the surface of the silicon substrate 11 is not covered with an oxide film (SOI device forming region 13 in which the silicon buffer layer 18 is formed). For instance, the layer is grown on the silicon substrate 18 in the SOI device forming region 13, by, for example, 30 nm, using disilane ($Si_2H_6$) and germane ($GeH_4$) gases, while maintaining the temperature of the silicon substrate 11 at 450 degrees C. Consequently, a single-crystal silicon germanium layer 15, inheriting the crystalline property of the silicon buffer layer 18, newly grows thereon. On the other hand, the silicon germanium layer 15 is not formed in the regions covered with oxide film, the regions but the SOI device forming region 13.

In the process shown in FIGS. 4A and 4B, a silicon (Si) layer 16 is formed as the second semiconductor layer for making the SOI device, on the silicon germanium layer 15 as well as on the silicon substrate 11 covered by the oxide film, or in other words, on the entire silicon substrate 11. Similar to the silicon buffer layer 18 and to the silicon germanium layer 15, the epitaxial growth is carried out to form the silicon layer 16. In the deposition condition, the silicon layer 16 is grown on the silicon germanium layer 15 and on the silicon substrate 11, by, for example, 100 nm, using disilane ($Si_2H_6$) gas, while increasing the temperature of the silicon substrate 11 from 450 degrees C. to 600 degrees C. Consequently, the silicon layer 16 grows across the entire top side of the silicon substrate 11. Consequently, a single-crystal first silicon layer 16a, inheriting the crystalline property of the silicon germanium layer 15, newly grows thereon. On the other hand, a polycrystalline second silicon layer 16b is formed on the oxide film (including the device isolation film 12) in the regions except for the SOI device forming region 13. The second silicon layer 16b is used as a stopper layer in the chemical mechanical polishing (CMP) carried out in the later process. The silicon buffer layer 18, the silicon germanium layer 15, and the first silicon layer 16a formed in the SOI device forming region 13 are collectively called a single-crystal epitaxial film 17.

With the above deposition condition, the silicon buffer layer 18 is selectively grown only on the silicon substrate 11 where the oxide film is not formed (on the SOI device forming region 13), thereby allowing the silicon germanium layer 15 to grow only on the silicon buffer layer 18. Further, it is possible to have the silicon germanium layer 15, which is not necessary except in the SOI device forming region 13, not to grow in the rest of the region except for the SOI device forming region 13.

In the process shown in FIGS. 5A and 5B, a first support hole 21 and a second support hole 22 are formed on the single-crystal epitaxial film 17. First, using the photolithography technique, an unillustrated resist pattern with openings is formed, the openings corresponding to a first support hole forming region 23 in which the first support hole 21 is to be formed, as well as to a second support hole forming region 24 in which the second support hole 22 is to be formed. Thereafter, using this resist pattern as a mask, part of the first silicon layer 16a, silicon germanium layer 15, silicon buffer layer 18, and of the silicon substrate 11 in the first support hole forming region 23 and in the second support hole forming region 24 are sequentially removed by etching. Consequently, the first support hole 21 and the second support hole 22 are formed in a single-crystal epitaxial region 19.

Moreover, by opening the first support hole 21 and the second support hole 22, one side 17a and the other side 17b of the single-crystal epitaxial film 17 are exposed, as well as a surface 11a of the silicon substrate 11. Here, the region between the first support hole 21 and the second support hole 22 becomes a device region 25.

In the process shown in FIGS. 6A and 6B, a support forming film 27, which is a layer for forming a support 26 (refer to FIGS. 7A and 7B), is formed on the entire silicon substrate 11. The support forming film 27 is, for instance, a silicon oxide film ($SiO_2$). First, the resist pattern used in the previous process is removed. Thereafter, by chemical vapor deposition (CVD), the support forming film 27 such as silicon oxide film is formed on the entire silicon substrate 11, to cover the silicon layer 16, as well as to burry the first support hole 21 and into the second support hole 22.

By forming such support forming film 27, a part 27a of the support forming film 27 buried into the first support hole 21, and the one side 17a of the single-crystal epitaxial film 17, are adhered closely. At the same time, a part 27b of the support forming film 27 buried into the second support hole 22 and the other side 17b of the single-crystal epitaxial film 17 are adhered closely.

In the process shown in FIGS. 7A and 7B, a part of the support forming film 27, except for a support forming region 28 in which the support 26 is formed, is removed. The removal is carried out by etching, using as a mask a resist pattern (not shown), part of which, except for the region corresponding to the shape of the support 26 viewed from the top, is open. Further, using the same resist pattern as a mask, a part of the second silicon layer 16b, and of the single-crystal epitaxial film 17 except for the support forming region 28, are removed.

Consequently, the support 26 is formed from the support forming film 27, and a first side 26a and a second side 26b (refer to FIG. 7A) are exposed. A third side 26c and a forth side 26d of the support 26 is closely adhered to the single-crystal epitaxial film 17. The sides of the single-crystal epitaxial film 17 located under the first side 26a and the second side 26b of the support 26 are exposed surfaces where the first silicon layer 16a, silicon germanium layer 15, and the silicon buffer layer 18 are exposed.

In the process shown in FIGS. 8A and 8B, the silicon germanium layer 15 and the silicon buffer layer 18 under the support 26 is selectively removed. First, the resist pattern used in the previous process is removed. Etching liquid such as fluoro-nitric acid is made to contact the single-crystal epitaxial film 17 below the support 26. At this time, the etching is carried out from the portions where the single-crystal epitaxial film 17 is exposed (the exposed surfaces in the lower part of the first side 26a and of the second side 26b of the support 26). It is possible to selectively etch and remove the silicon germanium layer 15 and the silicon buffer layer 18 while keeping the first silicon layer 16a, since the first silicon layer 16a has a smaller etching selection ratio than that of the silicon germanium layer 15 and of the silicon buffer layer 18.

Consequently, a cavity 29 having a hollow center is formed between the silicon substrate 11 and the first silicon layer 16a. The first silicon layer 16a is held (supported) by the third side 26c and the forth side 26d of the support 26, while supporting layers under the first silicon layer 16a are eliminated by forming the cavity 29.

In the process shown in FIGS. 9A and 9B, a buried insulation layer (buried oxide layer: BOX layer) 31 is formed in the hollow cavity 29. The buried insulation layer 31 is, for instance, a silicon oxide film, and is formed as a result of reaction between oxygen and silicon contained in the silicon substrate 11 and in the first silicon layer 16a, by using a thermo oxidation. In the thermo oxidation, the interior of a reactor that carries out the treatment is forced not to have a germanium atmosphere, since germanium, which is the cause of contamination, does not exist on the silicon substrate 11.

In the process shown in FIGS. 10A and 10B, the oxide film is buried into the necessary part on the silicon substrate 11, and the planarization is carried out on the silicon substrate. First, an insulation film 32 composed with silicon oxide film is formed on the entire top side of the silicon substrate 11, in order to electrically insulate the SOI device. The insulation film 32 is formed, for instance, with CVD method. Thereafter, the entire surface on the silicon substrate 11 is planarized using the second silicon layer 16b as the stopper layer, by CMP (planarization processing). Consequently, part of the insulation film 32, support 26, and of the support forming film 27 is removed. In the above-referenced CMP, contamination by germanium is less likely to occur, since, germanium, the cause of contamination does not exist on the silicon substrate 11.

In the process shown in FIGS. 1A and 11B, a semiconductor substrate 41 is completed. First, an unnecessary part of the support 26 on the first silicon layer 16a, a part of the insulation film 32, and the support forming film 27 on the second silicon layer 16b are removed. As a result, a top surface 16c of the first silicon layer 16a is exposed. Thereafter, the second silicon layer 16b is removed. In the above-referenced etching, the interior of a reactor that carries out the treatment is forced not to have a germanium atmosphere, since germanium, which is the cause of contamination, does not exist on the silicon substrate 11. Consequently, upon the silicon substrate 11 formed is a structure (SOI structure) in which the first silicon layer 16a undergoes device isolation isolated by the insulation film 32 and the buried insulation layer 31, thereby completing the gate electrode 41.

As described, according to the manufacturing method of the gate electrode 41, epitaxial growth is carried out in the condition that the silicon buffer layer 18 and the silicon germanium layer 15 are formed only in the SOI device forming region 13 on the silicon substrate 11, in other words, in the condition that they are not formed on the device isolation film 12 and on the bulk device forming region 14. Consequently, in the case where only the silicon germanium layer 15 under the silicon layer 16 is etched so as to burry the buried insulation layer 31, it is possible to reduce the remains of germanium on the silicon substrate 11, the germanium being the cause of the contamination.

Figure 12B:
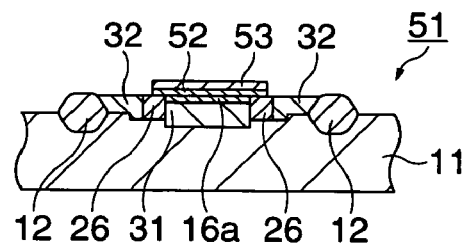
Figure 12C:
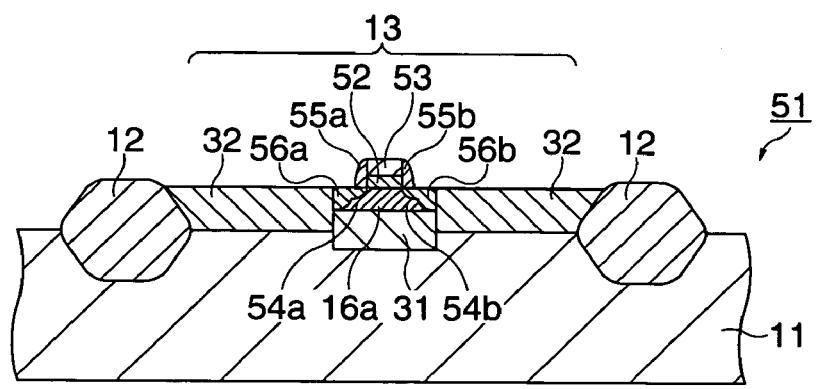
Figure 13:
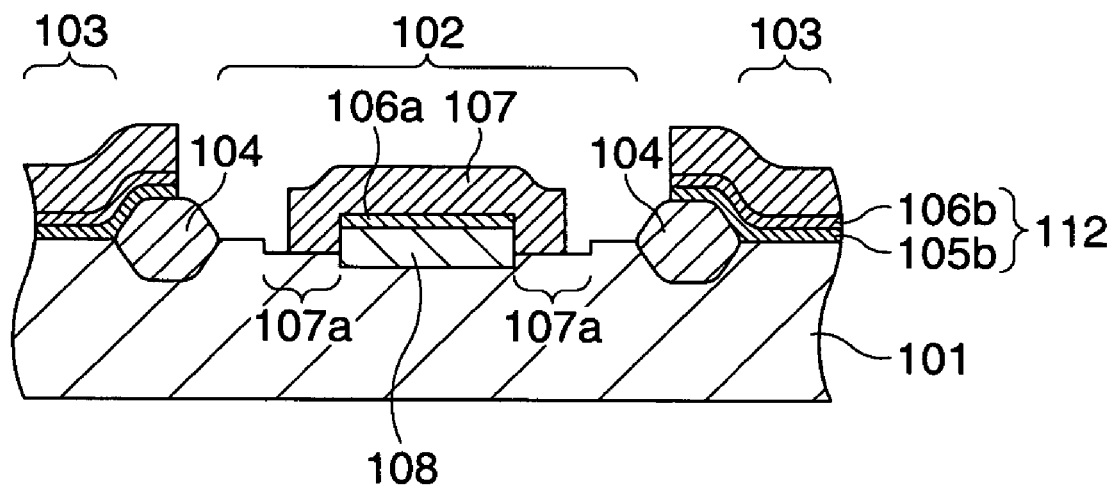
FIG. 13 is a schematic sectional drawing showing a manufacturing method of a semiconductor substrate of the related art.

FIGS. 12A to 12C are schematic drawings showing the manufacturing method of the semiconductor device. FIG. 12A is a schematic top view drawing showing the manufacturing method of the same. FIG. 12B is a schematic sectional drawing along the section A-A' of FIG. 12A. FIG. 12C is a schematic sectional drawing along the section B-B' of FIG. 12A. The method for manufacturing the semiconductor device will now be described with reference to drawings FIGS. 12A to 12C. Here, the method for manufacturing the semiconductor device is carried out subsequently to the method for manufacturing the semiconductor substrate described with reference to FIGS. 1A through 11B.

In the process shown in FIGS. 12A to 12C, a semiconductor device 51 is completed. First, the thermo oxidation is carried out on the surface of the first silicon layer 16a, and a gate insulation film 52 is formed on the surface of the first silicon layer 16a. A polycrystalline silicon layer is then formed on the gate insulation film 52 by, for instance, CVD method. Thereafter, a gate electrode 53 is formed on the gate insulation film 52 by patterning the polycrystalline silicon layer using the photolithography technique.

Subsequently, LDD layers 54a and 54b (refer to FIG. 12C) are formed in the first silicon layer 16a, the layers composed of low density dopant introduction layer arranged on both sides of the gate electrode 53, by an ion implantation of dopants such as arsenic (As), phosphorus (P), and boron (B) into the first silicon layer 16a, using the gate electrode 53 as a mask. An insulation layer is then formed on the first silicon layer 16a in which the LDD layers 54a and 54b are formed, by, for instance, CVD method, and side walls 55a and 55b are formed on the side walls of the gate electrode 53, by etching back the insulation layer, using dry etching such as reactive ion etching (RIE).

Thereafter, dopants such as As, P, and B are ion implanted into the first silicon layer 16a, using the gate electrode 53 and the side walls 55a and 55b as masks. Consequently, source/drain electrode layers 56a and 56b are formed on the side of the side walls 55a and 55b in the first silicon layer 16a, the layers composed of a high density dopant introduction layer, thereby the transistor is completed. Moreover, by forming the bulk device in the bulk device forming region 14, the semiconductor device 51, in which the SOI device and the bulk device are mixed-in, is formed on the silicon substrate 11.

As described, according to the method for manufacturing the semiconductor device 51, after removing the silicon germanium layer 15 beneath the first silicon layer 16a so as to bury the buried insulation layer 31, it is possible to reduce the volume of germanium that remains on the silicon substrate 11, the germanium being the cause of contamination. Hence, the semiconductor device 51 that can suppress the deterioration of the transistor characteristics is provided, even in the case where the treatments are carried out continuously.

According to the method for manufacturing semiconductor substrate and the method for manufacturing semiconductor device in accordance with the embodiment, the following advantage is provided.

According to the embodiment, the silicon buffer layer 18 and the silicon germanium layer 15 are deposited in a condition that they selectively grow only in the region where the silicon substrate 11 on which the oxide film is not formed (SOI device forming region 13). Hence, the buried insulation layer 31 can be buried substituting the silicon germanium layer 15 formed beneath the first silicon layer 16a. At the same time, after forming the support 26 and burying the buried insulation layer 31, it is possible to suppress the volume of remaining germanium, which is the cause of contamination, on the silicon substrate 11. Hence, in the subsequent process, the spread of germanium in the reactor can be suppressed, and thereby the deterioration of transistor characteristic, resulting from the adherence of germanium on the semiconductor substrate 11, can be suppressed.

The embodiment is not limited to the above, and may also be embodied in the following manner.

First Modification

Instead of the film deposition in a condition that the silicon buffer layer 18 and the silicon germanium layer 15 grow only on the region where the oxide film is not formed (SOI device forming region 13) as described above, the silicon buffer layer 18 can be deposited on the oxide film, as long as the film thickness thereof is such that the silicon germanium layer 15 would not grow on the oxide film.

Second Modification

The described method for forming the buried insulation layer 31 in the cavity 29 is not limited to thermo oxidation, and may include, for instance, CVD method.

Third Modification

Silicon is used, as described, as a material of the semiconductive base. However, the material is not limited thereto, and may include, for instance, Ge, SiGe, SiC, SiSn, PbS, GaAs, InP, GaP, GaN, ZnSe.

Forth Modification

As described, silicon germanium is used as an example of the material for the first semiconductor layer, and silicon is used as an example of the material for the second semiconductor layer. What is important is to combine the first semiconductor layer and the second semiconductor layer that has a smaller etching selection ratio than that of the first semiconductor layer. For example, materials for the first semiconductor layer and the second semiconductor layer may be a combination selected from Ge, SiC, SiSn, PbS, GaAs, InP, GaP, GaN, and ZnSe.

Fifth Modification

Instead of disilane ($Si_2H_6$) gas used for carrying out epitaxial growth, silane ($SiH_4$) or dichlorosilane ($SiH_2Cl_2$) gases may be used.

What is claimed is:

1. A method for manufacturing a semiconductor substrate, comprising:

forming a first semiconductor layer on a semiconductive base;

forming a second semiconductor layer, having a smaller etching selection ratio than that of the first semiconductor layer, on the first semiconductor layer;

removing part of the first semiconductor layer and the second semiconductor layer in the vicinity of device region, so as to form a support hole that exposes the semiconductive base;

forming a support forming layer on the semiconductive base, so that the support hole is buried and the second semiconductor layer is covered;

leaving an region that includes the support hole and the element region, etching the rest, so that an exposed surface is formed, where a part of edges of a support, the first semiconductor layer, and of the second semiconductor layer located at the lower side of the support are exposed;

forming a cavity between the second semiconductor layer and the semiconductive base by etching the first semiconductor layer through the exposed surface;

forming a buried insulation layer inside the cavity; and planarizing the top side of the second semiconductor layer and removing the part of the support above the second semiconductor layer;

wherein, in forming the first semiconductor layer, the first semiconductor layer is deposited with a first condition on a first region where an oxide film does not exist on the semiconductive base.

2. The method for manufacturing the semiconductor substrate according to claim 1, wherein in forming the first semiconductor layer and in forming the second semiconductor layer, epitaxial growth technique is used in order to grow the first semiconductor layer and the second semiconductor layer.

3. The method for manufacturing the semiconductor substrate according to claim 1, wherein the first condition for forming the first semiconductor layer is to maintain the temperature of the semiconductive base, and to deposit the first semiconductor layer on the first region in the thickness of 30 nm.

4. The method for manufacturing the semiconductor substrate according to claim 1, further comprising:

forming, prior to forming the first semiconductor layer, a third semiconductor layer on the semiconductive base, so that the first semiconductor layer is formed inheriting a crystalline property of the semiconductive base;

wherein, in forming the third semiconductor layer, the third semiconductor layer is deposited with a second condition, only on a region where the semiconductive base is exposed.

5. The method for manufacturing the semiconductor substrate according to claim 4, wherein the second condition for forming the third semiconductor layer is to deposit the third semiconductor layer on the first region in the thickness of 20 nm, while decreasing the temperature of the semiconductive base from 600 degrees centigrade to 450 degrees centigrade inclusive.

6. The method for manufacturing the semiconductor substrate according to claim 1, wherein a deposition condition for forming the second semiconductor layer is to deposit the second semiconductor layer on the first semiconductor layer and on the semiconductive base in the thickness of 100 nm, while increasing the temperature of the semiconductive base from 450 degrees centigrade to 600 degrees centigrade inclusive.

7. The method for manufacturing the semiconductor substrate according to claim 1, wherein:

the first semiconductor layer is composed of a silicon germanium layer; and the second semiconductor layer is composed of a silicon layer.

8. A method for manufacturing a semiconductor device comprising:

forming a transistor on the second semiconductor layer after conducting the method for manufacturing the semiconductor substrate according to claim 1.

* * * * *